United States Patent [19]
Horikoshi et al.

[11] Patent Number: 5,236,772
[45] Date of Patent: Aug. 17, 1993

[54] CIRCUIT BOARD AND PROCESS FOR PRODUCING SAME

[75] Inventors: Eiji Horikoshi, Isehara; Motoaki Tani, Atsugi; Isao Watanabe, Sagamihara; Katsuhide Natori; Takehiko Sato, both of Yokohama, all of Japan

[73] Assignee: Fujitsu Limited, Kawasaki, Japan

[21] Appl. No.: 761,646

[22] Filed: Sep. 18, 1991

[30] Foreign Application Priority Data

Sep. 18, 1990 [JP] Japan ................................ 2-246121
Jul. 30, 1991 [JP] Japan ................................ 3-190094

[51] Int. Cl.$^5$ .............................................. B32B 9/00
[52] U.S. Cl. ................................... 428/209; 428/245; 428/328
[58] Field of Search ........................ 428/209, 245, 328

[56] References Cited

U.S. PATENT DOCUMENTS

| | | | |
|---|---|---|---|
| 3,672,849 | 6/1972 | Bredzs et al. | 428/209 |
| 4,087,300 | 5/1978 | Adler | 156/192 |
| 4,125,661 | 11/1978 | Messerschmidt, Jr. | 428/209 |
| 4,609,586 | 9/1986 | Jensen et al. | 428/209 |

FOREIGN PATENT DOCUMENTS

| | | |
|---|---|---|
| 0239839 | 10/1987 | European Pat. Off. . |
| 0244699 | 11/1987 | European Pat. Off. . |
| 0247575 | 12/1987 | European Pat. Off. . |
| 2234408 | 1/1973 | Fed. Rep. of Germany . |
| 2741417 | 3/1978 | Fed. Rep. of Germany . |

Primary Examiner—Patrick J. Ryan
Assistant Examiner—Cathy Lee
Attorney, Agent, or Firm—Staas & Halsey

[57] ABSTRACT

A circuit board comprising: a core material made from magnesium, a magnesium alloy, or a magnesium-based composite material, and an electric circuit formed on the core material. A process for producing the circuit board comprises the steps of (1) forming an electrodeposition-painted coating on such a core material, (2) forming a polyimide resin coating on the electrodeposition-painted coating, (3) forming a via hole extending through the resin coating to the underlying electrodeposition-painted coating, (4) etching and removing the electrodeposition-painted coating in the region exposed in the bottom of the via hole while masking the other region with the resin coating thereby extending the via hole to the core material, (5) forming a metal film on at least a free surface of the resin coating and an inner surface of the extended via hole, and (6) etching the metal film by using a photoresist mask to form a conductor layer having a predetermined pattern.

13 Claims, 16 Drawing Sheets

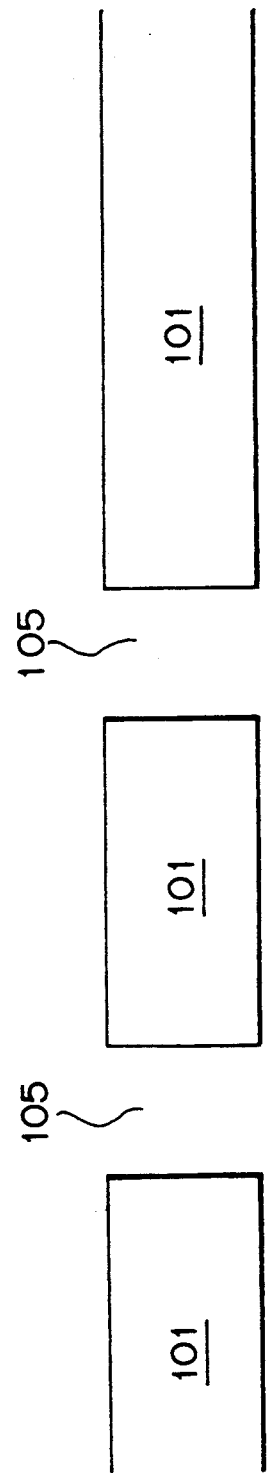

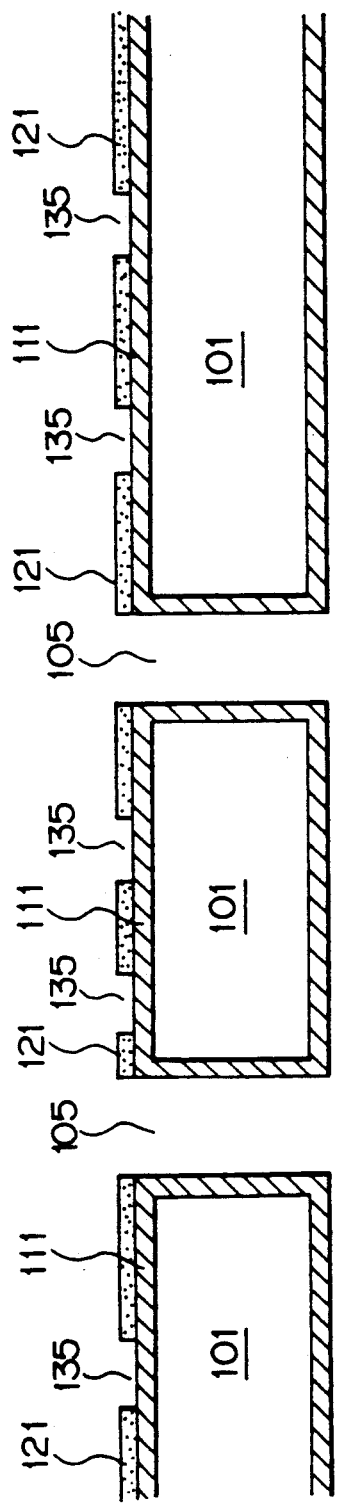

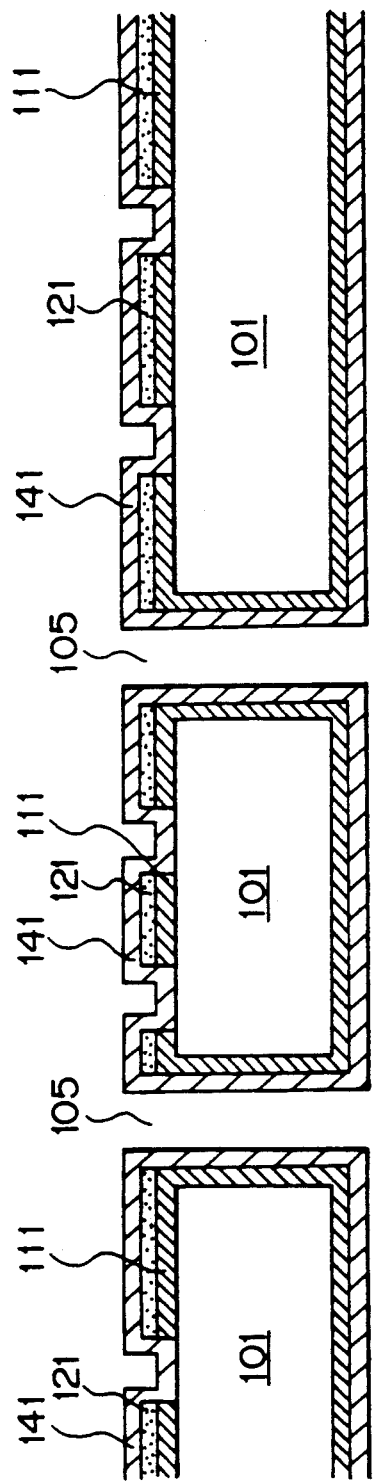

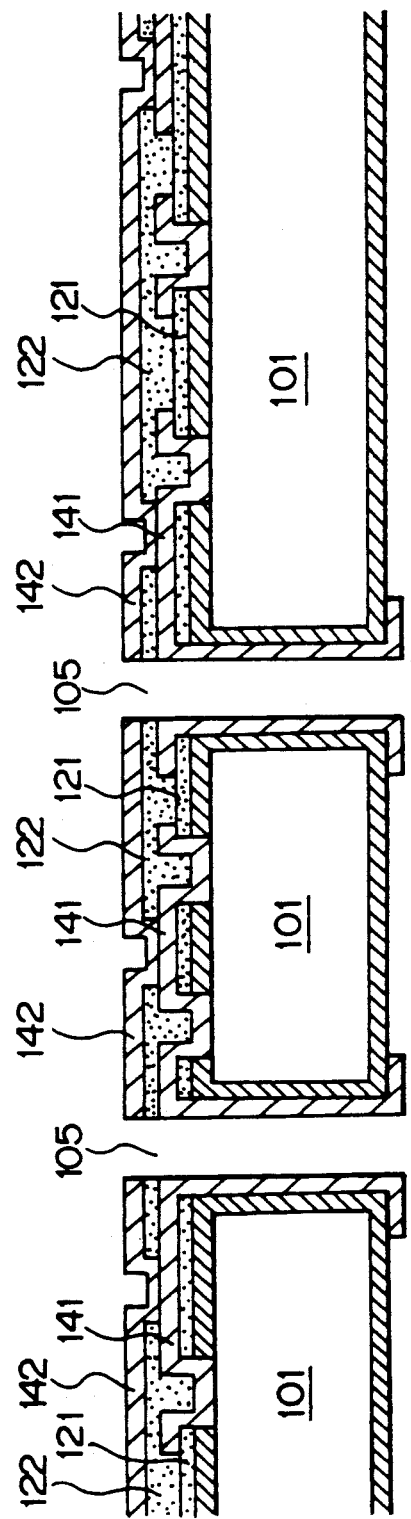

CIRCUIT BOARD AND PROCESS FOR PRODUCING SAME

BACKGROUND OF THE INVENTION

1. Field of the Invention

The present invention relates to a circuit board having an electric circuit formed therein, and a process for producing same.

2. Description of the Related Art

A known circuit board comprises a core material of a metal such as copper, iron, aluminum, or an alloy based thereon, and an electric circuit formed on the core material. The circuit board in which such a metal core is used provides a superior heat radiation and electromagnetic shielding in comparison with those circuit boards in which a core material of a resin is used, and has a superior impact resistance and workability or formability in comparison with those circuit boards in which a core material of ceramics is used.

To provide further miniaturized and more lightweight portable electronic equipment, however, a circuit board having a lighter weight than the conventional board, and a process for producing same, are desired.

SUMMARY OF THE INVENTION

The object of the present invention is to provide a miniaturized and lightweight circuit board having the superior properties of a conventional board in which a metal core material is used.

To achieve the above object according to the present invention, there is provided a circuit board comprising: a core material selected from a group consisting of magnesium, a magnesium alloy, and a magnesium-based composite material; and an electric circuit formed on the core material.

According to the present invention, there is also provided a process for producing a circuit board, comprising the steps of:

(1) forming an electrodeposition-painted coating on a core material selected from a group consisting of magnesium, a magnesium alloy, and a magnesium-based composite material;

(2) forming a polyimide resin coating on said electrodeposition-painted coating;

(3) forming a via hole extending through said resin coating to said underlying electrodeposition-painted coating;

(4) etching and removing said electrodeposition-painted coating in the region exposed in the bottom of said via hole, while masking the other region with said resin coating, to extend the via hole to said core material;

(5) forming a metal film on at least a free surface of said resin coating and a inner surface of the extended via hole; and (6) etching said metal film by using a photoresist mask to form a conductor layer having a predetermined pattern.

BRIEF DESCRIPTION OF THE DRAWINGS

FIGS. 1(a) and 1(b) are respectively perspective and side views;

FIGS. 2(a) and 2(b) are respectively perspective and side views;

FIGS. 6(a) to 6(g) show a series of process steps for producing a circuit board according to the present invention, in sectional view; and FIGS. 7(a) to 7(d) show a series of process steps according to the present invention which follows the step of FIG. 6(g), to form a multilayered circuit, in sectional view.

DESCRIPTION OF THE PREFERRED EMBODIMENTS

Figure 1A:
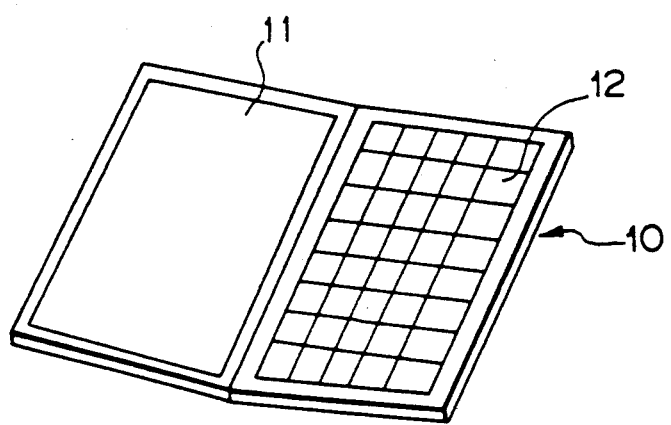
FIGS. 1(a) and 1(b) show an electronic pocket notebook to which a circuit board according to the present invention is applied.

Magnesium is one of the lightest weight metals for practical applications and has a high specific strength or strength with respect to the unit volume. Magnesium, as it is a metallic material, has a thermal conductivity three orders of magnitude greater and an electric resistance eighteen orders of magnitude smaller than the nonmetallic materials such as a glass-epoxy composite, alumina ceramics, etc., conventionally used as a core material of a printed circuit board, as shown in Table 1. A high thermal conductivity enables the heat generated in electronic devices to be efficiently released therefrom, and a small electric resistance provides a good electromagnetic shielding.

TABLE 1

Properties of Core Materials for Circuit Boards

| Material | Copper | Iron | Aluminum | Magnesium | Glass-Epoxy | Alumina ceramics |
|---|---|---|---|---|---|---|
| Density (g/cm$^3$) | 8.9 | 7.8 | 2.7 | 1.7 | 1.6 | 3.7 |
| Thermal conductivity (W/m-K) | 394 | 73.3 | 238 | 167 | 0.3 | 28.1 |
| Thermal expansion coefficient ($\times 10^{-6}$/K) | 17.1 | 12.2 | 23.9 | 26.1 | 110 | 6 |
| Electrical resistivity ($\mu\Omega$-cm) | 1.7 | 10.1 | 2.7 | 4.2 | $10^{18}$ | $10^{20}$ |

TABLE 1-continued

| | Properties of Core Materials for Circuit Boards | | | | | |
|---|---|---|---|---|---|---|
| Material | Copper | Iron | Aluminum | Magnesium | Glass-Epoxy | Alumina ceramics |
| Bending strength (kg/mm$^2$) | 35 | 55 | 30 | 20 | 40 | 35 |

The present inventive circuit board performs well, and simultaneously, is lighter in weight than the conventional circuit boards, due to the use of a core material comprising magnesium, which is extremely lightweight and provides a superior strength, heat release, and electromagnetic shielding.

A magnesium alloy provides a core with a higher strength than a pure magnesium core, while retaining the inherent light weight of magnesium, and a magnesium-based composite can provide an even higher strength.

The present inventive core material advantageously includes a magnesium alloy containing one or more alloying elements selected from the group consisting of aluminum, zinc, zirconium, lithium, particularly from the viewpoint of strength. An addition of these elements makes the core strength up to 1.2-3 times higher than that of a pure magnesium core.

To further increase the core strength, the core material may include a magnesium-based composite material which comprises: a matrix phase consisting of magnesium or a magnesium alloy containing one or more alloying elements selected from the group consisting of aluminum, zinc, zirconium, and lithium; and a reinforcement phase in the form of a particle, a whisker, or a fiber, dispersed in the matrix phase and including one or more elements or compounds selected from the group consisting of boron, carbon, boron carbide, silicon carbide, and alumina. Such a composite material provides a core strength of up to 1.5 to 2 times higher than that of the matrix phase.

A higher core strength (specific strength) provides a further miniaturized and lighter weight circuit board.

To provide a simple structure for electronic equipment, the core material most preferably forms at least part of the body or casing of the electronic device.

Generally, as magnesium is chemically active, the core preferably is provided with a corrosion protective surface coating. When an electrically insulating coating is used as such a surface coating, an electrical circuit may be formed directly on the surface coating. Such an electrically insulating, corrosion protective surface coating is easily formed by an electrodeposition painting or an anodic oxidation.

Generally, corrosion protection of a magnesium-based structural material including pure magnesium, magnesium alloys, magnesium-based composite materials, etc., is effected by using a corrosion resistant coating such as an anodic oxidized coating or an electrodeposition-painted coating.

When a magnesium-based material is used as the core material of a circuit board, the surface coating is preferably formed by electrodeposition painting, because it is necessary to form a dense electrically insulating coating on the core surface. Nevertheless, problems of productivity and production cost arise because providing an electrical connection between the conductor layer formed on an electrodeposition-painted coating and the underlying core of a magnesium-based material requires a separate step for forming a via hole. This step is in addition to the electrodeposition painting step.

On the other hand, polyimide materials, in which a minute via hole can be formed, are known as an insulating film for a thin film circuit. However, it is practically impossible to form an insulating polyimide coating directly on a magnesium-based core material. This is because an imidization takes place during the curing of the liquid resin when the temperature reaches about 300° C. The imidization generates a water phase, which reacts with the magnesium-based core and exfoliates the polyimide coating from the core.

The present inventive process for producing a circuit board first forms a dense, antimoisture electrodeposition-painted coating on a magnesium-based core material, and then forms a polyimide insulating coating thereon. A via hole is formed in the polyimide insulating coating, followed by an etching of the electrodeposition-painted coating by using the polyimide coating as a mask to extend the via hole to the magnesium-based core material. Thus, according to the present invention, a fine conductor pattern can be easily formed on a magnesium-based core material. This was conventionally very difficult.

Polyimide resins are electrically insulating and have a high heat resistance such that no deterioration thereof occurs at an elevated temperature such as encountered in any later soldering step. Therefore, the resins need not be removed after being used as a mask like a photoresist, and can be used as an insulating film in a finally completed circuit. Polyimide is easily applied on a core material by spin coating or dip coating, etc., to form a coating.

Fluororesins, epoxy resins, and acrylic resins, etc. may be used as an alternative to polyimide resins, although they have a disadvantage in that fluororesins are difficult to apply and epoxy and acrylic resins have a relatively poor heat resistance.

Polyimide has a drawback in that it is relatively expensive. Japanese Patent Application No. 2-279088 by the same assignee discloses a blended resin composed of polyimide and acrylic monomer, which can reduce the material cost while ensuring the necessary properties such as the heat resistance.

The preferred embodiments of the present invention will be described in detail by way of examples.

EXAMPLE 1

Figure 1B:
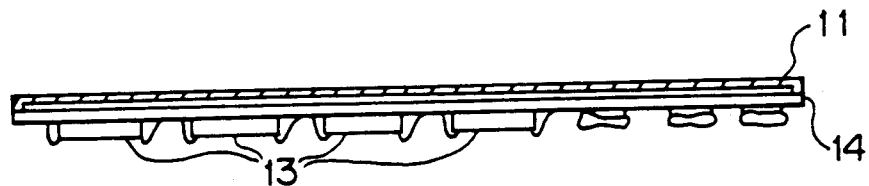

FIGS. 1(a) and 1(b) show an electronic pocket notebook 10 in which a circuit board according to the present invention is used as a structural member: FIG. 1(a) being a perspective view showing an electronic pocket notebook 10 opened to expose the side provided with a film liquid crystal 11 and the side provided with a keyboard 12; and FIG. 1(b) being a side view of the display unit incorporated in the notebook 10, including the film liquid crystal 11.

The film liquid crystal 11 is so flexible that it cannot support itself and is stuck on and held by a circuit board 14. Electric elements 13 are arranged on one side of the circuit board 14 to form an electric circuit and the film liquid crystal 11 is stuck on the other side. The circuit board 14 forms the structural member of the film liquid crystal 11, the drive of a display circuit, and the circuit portion of the electronic pocket notebook 10.

The electronic pocket notebook 10 of FIGS. 1(a) and 1(b) has a size corresponding to the "A5" paper size (ISO or JIS) when opened, a thickness of about 5 mm, and a weight of 120 g, which is thinner by 2 mm and lighter by 40 g than a conventional electronic pocket notebook of the same "A5" size, in which a liquid crystal is held on a glass plate and a glass-epoxy composite circuit board is used.

EXAMPLE 2

Figure 2A:
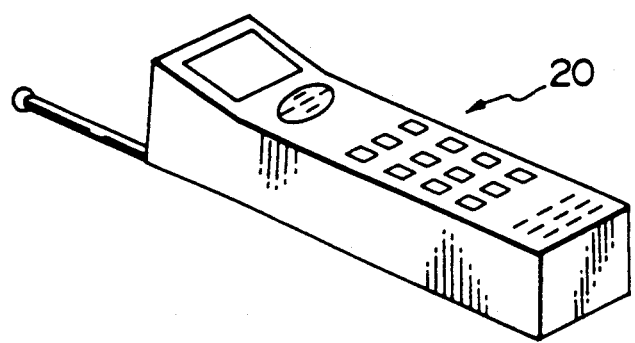
FIGS. 2(a) and 2(b) show a portable telephone to which a circuit board according to the present invention is applied.
Figure 2B:
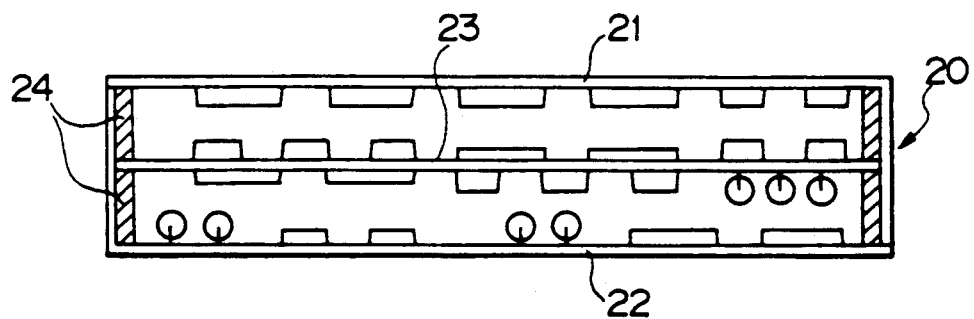

FIGS. 2(a) and 2(b) show a portable telephone 20 in which a circuit board according to the present invention is used as an electromagnetic shield plate as well as part of the structure of the telephone 20: FIG. 2(a) being a perspective view of the telephone 20; and FIG. 2(b) being a sectional view at the half width portion of the telephone 20.

Electric circuits are formed on one side of each of circuit boards 21 and 22 having an "L"-shaped section and assembled in a manner such that the sides of the circuit boards 21 and 22 are facing each other to form a casing of the telephone 20. Another circuit board 23, on both sides of which electric circuits are formed, is arranged at the midthickness of the casing, and a connector 24 connects these circuit boards 21, 22, and 23. The circuit boards 21 and 22 forming the casing also function as an electromagnetic shield plate.

In the conventional portable telephone, an electromagnetic shield plate of copper or aluminum, on which no circuit parts are mounted, is provided separately from a printed circuit board made of glass-epoxy composite for mounting parts.

According to the present invention, a circuit board also serves as a shield plate, and thereby the packaging density and the miniaturization can be made greater in comparison with the conventional portable telephone. Moreover, a lightened weight of the circuit board directly leads to a lightened weight of the telephone as a whole.

A surprisingly miniaturization and weight reduction was achieved according to the present invention, i.e., the volume of a telephone was reduced from 450 to 120 cc and the weight was reduced from 750 g to 230 g.

Moreover, because magnesium has a superior thermal conductivity, there is no need for a special means to remove the heat of the semiconductor devices used in an electric circuit. Therefore, further miniaturization and weight reduction are possible according to the present invention.

Figure 3A:
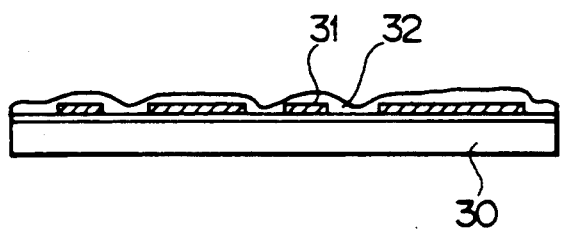
FIGS. 3(a) and 3(b) exemplify circuit boards according to the present invention, with FIG. 3(a) showing a circuit board according to the present invention produced by printing and FIG. 3(b) showing a circuit board according to the present invention produced by a thin film circuit process, each in sectional view.
Figure 3B:
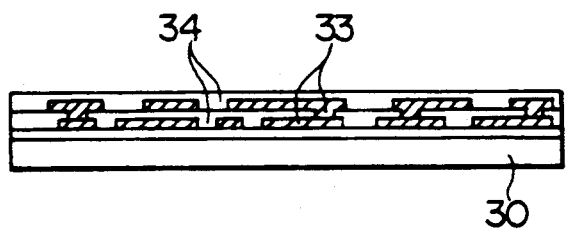

An electric circuit of the present inventive circuit board is formed in a manner as shown in FIGS. 3(a) and 3(b). For example, it can be formed as shown in FIG. 3(a), by printing a conductive paste 31 and an insulating resin 32 on a core material. FIG. 3(a) or by a thin film circuit process in which a conductor film 33 is formed by vapor deposition or sputtering, then an insulating film 34 is formed by spin coating. The printing process is inexpensive but has a limited refinement, whereas the thin film circuit process can provide a refinement as fine as several μm, and therefore, the latter is performed for a high density packaging.

Figure 4A:
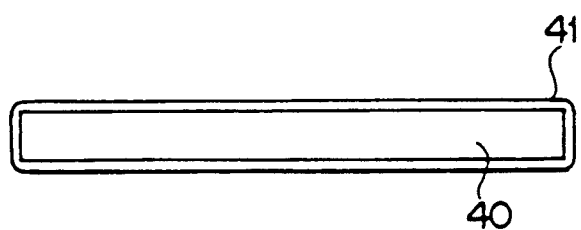
FIGS. 4(a) and 4(b) exemplify circuit boards according to the present invention treated for corrosion protection, in sectional view.
Figure 4B:
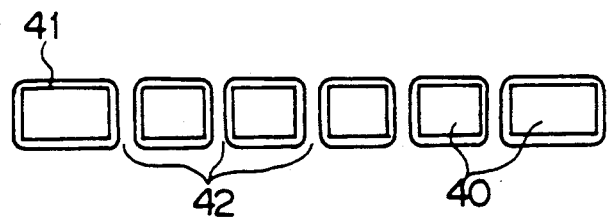

Because magnesium is chemically active and has a poor corrosion resistance, it is necessary, as shown in FIG. 4(a), to coat a core material 40 with a corrosion protective coating or a corrosion protective and electrically insulating coating 41. This is done in an electrically insulating treatment such as an electrodeposition painting, an anodic oxidation, etc. Because magnesium is highly workable, a throughhole can be easily formed by machining. An insulating and corrosion protective throughhole may be formed by machining a throughhole 42 and then forming the above-mentioned coating 41 as shown in FIG. 4(b).

Figure 5A:
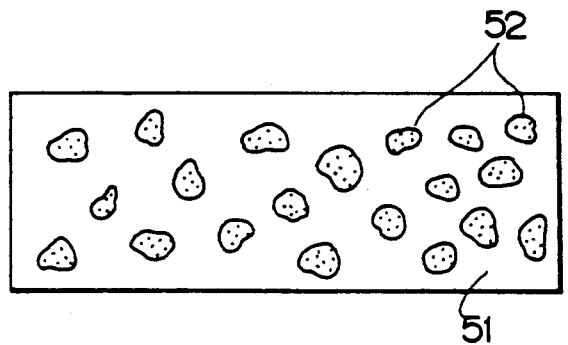
FIGS. 5(a) and 5(b) exemplify structures of composite materials used as a core material of a circuit board according to the present invention, in sectional view.
Figure 5B:
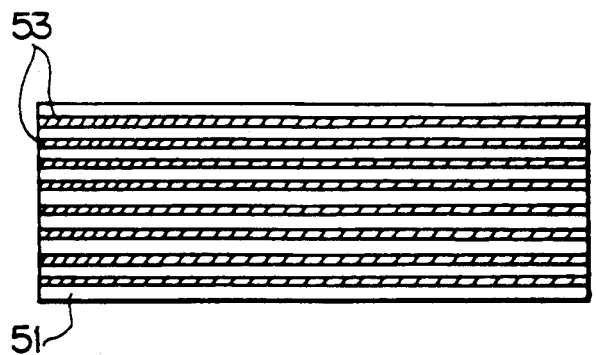

The magnesium-based composite materials used for the core material of the present inventive circuit board may be composite materials such as shown in FIGS. 5(a) and 5(b), comprising a reinforcement 53 of at least one of a particle (FIG. 5(a)) or a whisker or a fiber (FIG. 5(b)) of boron, carbon, boron carbide, silicon carbide, and alumina (FIG. 5(a)).

EXAMPLE 3

Referring to FIGS. 6(a) to 6(g), a process for producing a circuit board according to the present invention will be described below.

Step 0

As shown in FIG. 6(a), 0.2 to 2 mm dia. throughholes 105 were formed (two of which are shown in Figure) by drilling a 76×76 mm square, 0.5 mm thick core material 101 of a magnesium alloy (ASTM AZ31).

Step 1

Figure 6B:
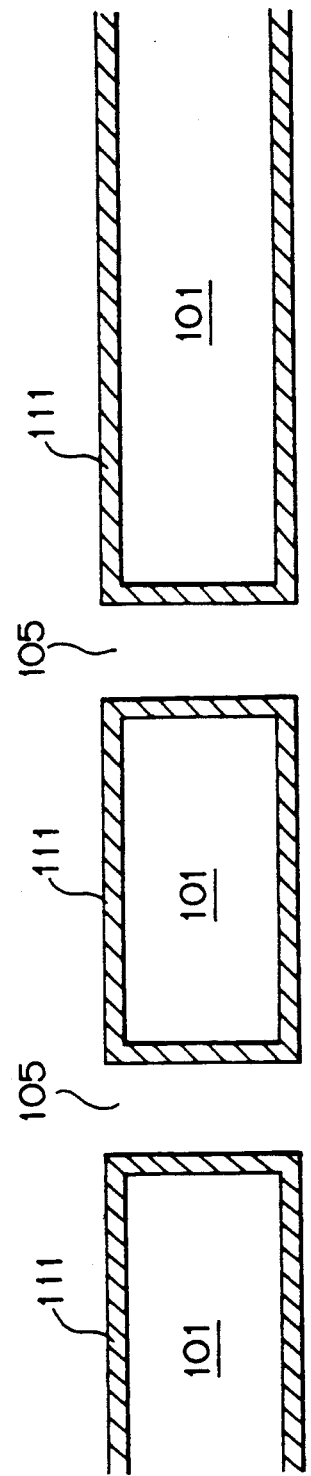

As shown in FIG. 6(b), a 20 μm thick electrodeposition-painted coating 111 was formed on the entire surface of the core material 101 by a cation deposition of a main composition of an epoxy resin in which an amino group had been introduced, under a current density of from 1 to 10 A/dm$^2$.

Step 2

Figure 6C:
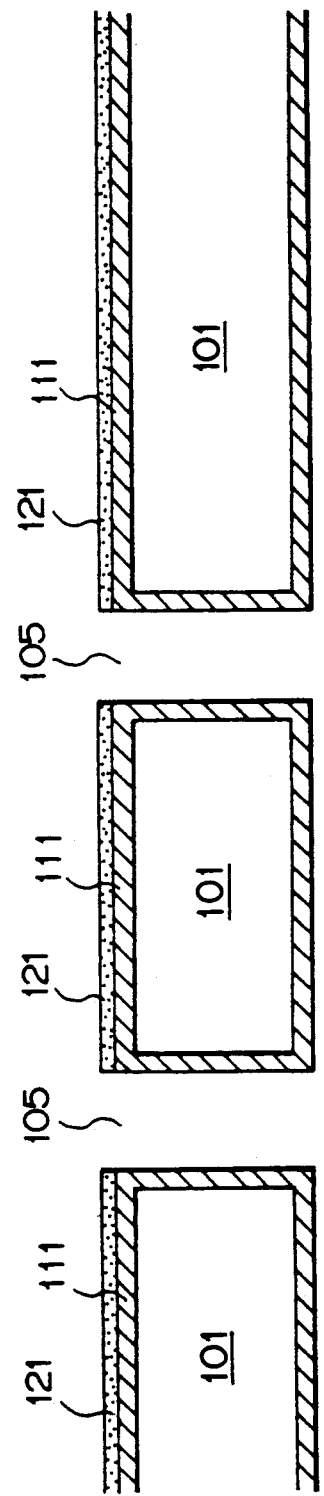

A photosensitive polyimide was spin-coated at a rotation speed of from 500 to 6000 rpm on the electrodeposition-painted coating 111 on the upper surface of the core material 101, to form a 10 μm thick polyimide coating 121, as shown in FIG. 6(c). The polyimide coating was then prebaked at a temperature of from 80° to 120° C. for 1 hour.

Step 3

As shown in FIG. 6(d), via holes 135 having a diameter of 10 to 100 μm were formed in the polyimide coating 121 by exposing the polyimide coating 121, using a glass mask, to an ultraviolet light having a wavelength of 365 nm at an energy of 300 mJ, and then carrying out a wet type development in which a developer of N-methyl-2-pyrolidone (NMP) and a rinse of ethyl alcohol were used.

Step 4

Figure 6E:
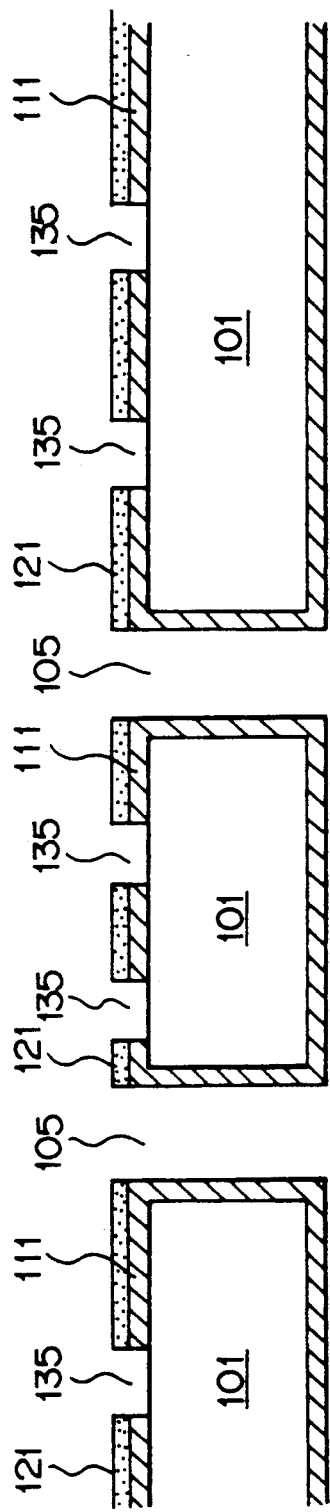

The electrodeposition-painted coating 111 was dry-etched with CF$_4$ gas by using the polyimide coating 121 as a resist mask, so that the via holes 135 penetrated the electrodeposition-painted coating 111 and reached the core material 101, as shown in FIG. 6(e).

Usually, the resist mask must be removed after the etching, but a polyimide coating can endure a high temperature processing such as soldering and need not be removed. When retained, the polyimide coating 121 is used as an insulating layer of the final electric circuit, providing an improved heat resistance of a circuit board.

Step 5

As shown in FIG. 6(f), a metal film of copper 141 was formed on the polyimide coating 121, the electrodeposition-painted coating 111, and the core material 101 exposed in the via holes 135, by a chemical plating or an electroplating.

Step 6

Figure 6G:
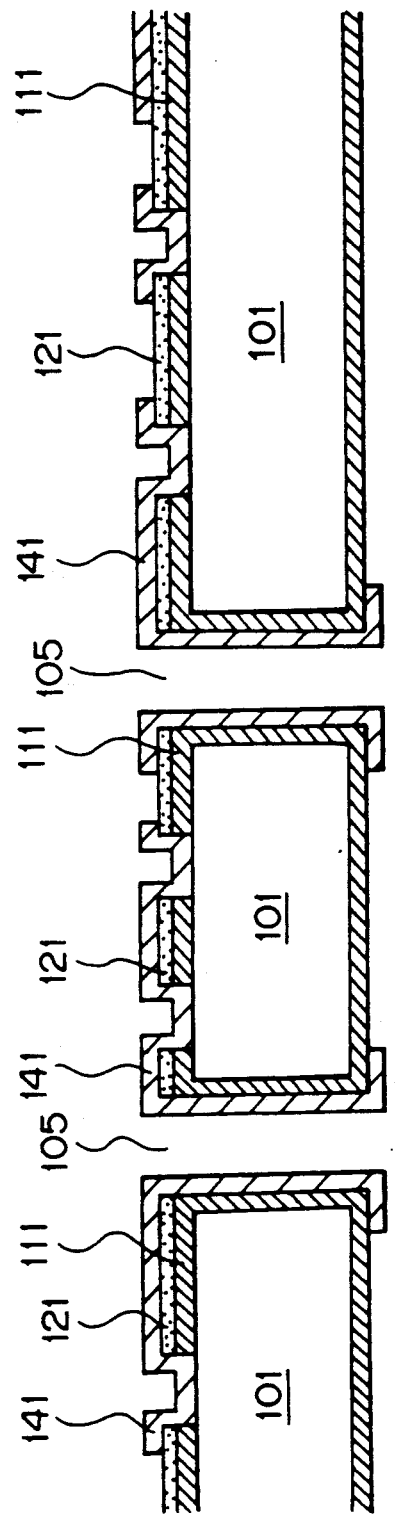

A resist layer (not shown) having a reversed pattern of a predetermined conductor pattern was formed on the metal film 141, which was then etched with an etchant solution including ferric chloride by using the resist layer as a mask. This formed conductor layer of the metal film 141 having the predetermined pattern, as shown in FIG. 6(g).

A multilayered circuit board can be produced by additional processing, i.e., by further forming other conductor layers on the above-prepared circuit board in a manner as shown in FIGS. 7(a) to 7(d), for example, i.e., in the following sequence.

Additional Step A1

Figure 7A:
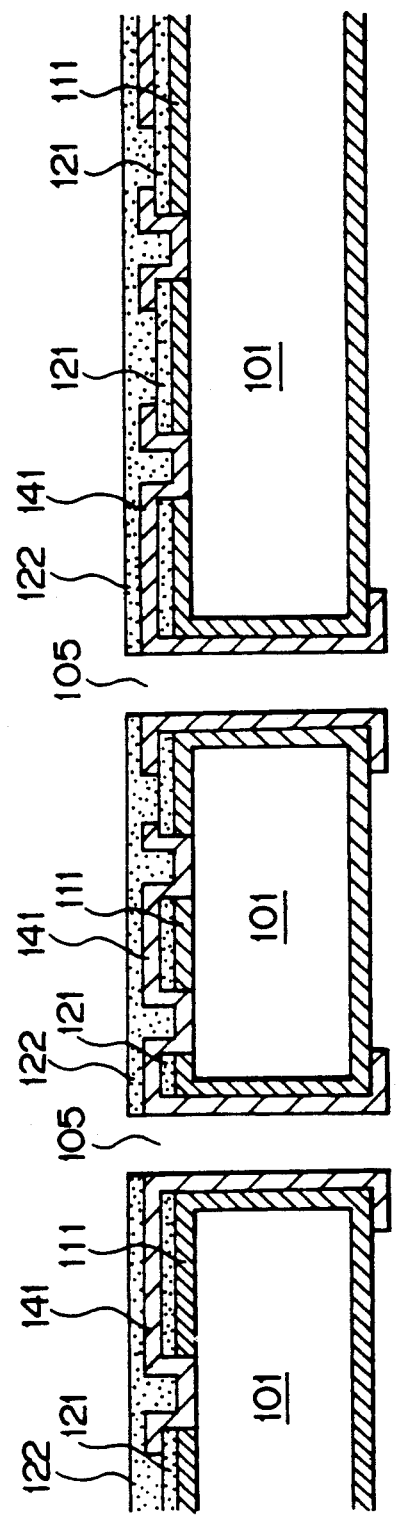

As shown in FIG. 7(a), a polyimide coating 122 is formed on the entire of the upper surface core 101, in a manner similar to the previous step 2.

Additional Step A2

Figure 7B:
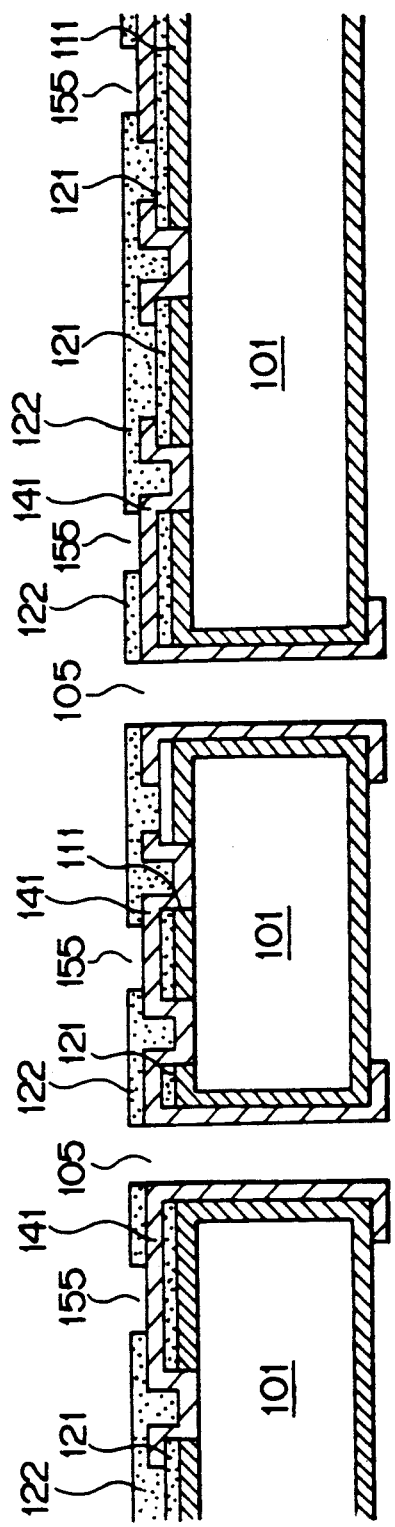

As shown in FIG. 7(b), via holes 155 are formed in the polyimide coating 122 to expose the metal film 141 in the region of the via holes 155, in a manner similar to the previous step 3.

Additional Step A3

As shown in FIG. 7(c), a metal film 142 is formed in a manner similar to the previous step 5.

Additional Step A4

Figure 7D:
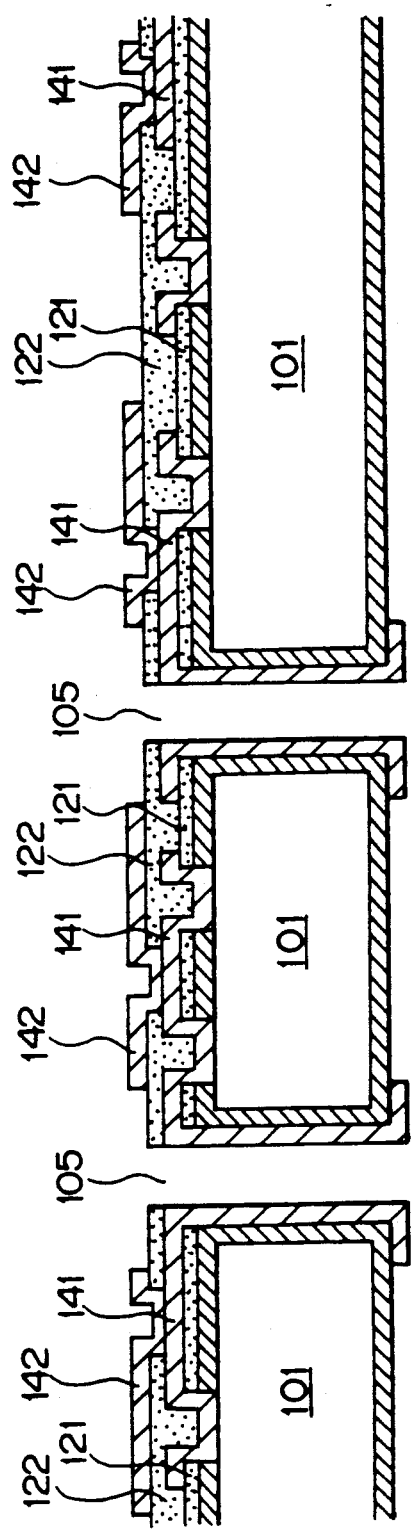

As shown in FIG. 7(d), the metal film 142 is etched in a predetermined pattern forming a conductor layer of the metal film 142, in a manner similar to the previous step 6.

The previous steps 0 to 6 and the additional steps A1 to A4 provide a multilayered circuit board having two conductor layers 141 and 142.

A further multiplication of conductor layers can be obtained by repeating the additional steps A1–A4 the required number of times.

We claim:

1. A lightweight circuit board comprising:
   a core material selected from a group consisting of magnesium and a magnesium alloy; and
   an electric circuit formed on said core material.

2. A circuit board according to claim 1, wherein said magnesium alloy contains at least one alloying element selected from a group consisting of aluminum, zinc, zirconium, and lithium.

3. A circuit board according to claim 1, wherein said magnesium-based composite material comprises:
   a matrix phase including at least one of magnesium and magnesium alloy containing at least one alloying element selected from a group consisting of aluminum, zinc, zirconium, and lithium; and
   a reinforcement phase dispersed in said matrix phase, said reinforcement phase being at least one of a particle, a whisker and a fiber, and consisting of at least one material selected from a group consisting of boron, carbon, boron carbide, silicon carbide, and alumina.

4. A circuit board according to claim 1, wherein said core material comprises at least part of the body of an electronic device or a casing accommodating an electronic device.

5. A circuit board according to claim 1, wherein said core material has a corrosion protective surface coating.

6. A circuit board according to claim 5, wherein said corrosion protective surface coating is at least one of an electrodeposition-painted coating and an anodic oxidation coating.

7. A circuit board according to claim 6, wherein said core material further has a heat resisting resin coating formed on said electrodeposition-painted coating.

8. A lightweight circuit board comprising:
   a core material containing a magnesium alloy; and
   an electric circuit formed on said core.

9. A lightweight circuit board comprising:
   a magnesium-based composite core material; and
   an electric circuit formed on said core material.

10. A circuit board according to claim 9, wherein said core material comprises at least part of the body of an electronic device or a casing accommodating an electronic device.

11. A circuit board according to claim 9, wherein said core material has a corrosion protective surface coating.

12. A circuit board according to claim 11, wherein said corrosion protective surface coating is at least one of an electrodeposition-painted coating and an anodic oxidation coating.

13. A circuit board according to claim 12, wherein said core material further has a heat resisting resin coating formed on said electrodeposition-painted coating.

* * * * *

UNITED STATES PATENT AND TRADEMARK OFFICE
CERTIFICATE OF CORRECTION

PATENT NO. : 5,236,772
DATED : August 17, 1993
INVENTOR(S) : Eiji HORIKOSHI et al.

It is certified that error appears in the above-identified patent and that said Letters Patent is hereby corrected as shown below:

Item [57] ABSTRACT: line 3,
      change "material," to --material--.

Column 2, table 1, under <u>Glass-Epoxy</u>, change "$10^{18}$" to --$\approx 10^{18}$--;
      under <u>Alumina Ceramics</u>, change "$10^{20}$" to --$\approx 10^{20}$--;

Column 3, line 24, change "zinc." to --zinc,--;
  line 33, change "zinc;" to --zinc,--.

Column 5, line 61, change "Fig. 3(a) or" to --It can also be formed as shown in Fig. 3(b)--.

Column 7, line 21, delete "of the";
      line 26, change "holes" to --hole--.

UNITED STATES PATENT AND TRADEMARK OFFICE
CERTIFICATE OF CORRECTION

PATENT NO. : 5,236,772
DATED : August 17, 1993
INVENTOR(S) : Eiji Horikoshi et al It is certified that error appears in the above-indentified patent and that said Letters Patent is hereby corrected as shown below:

Column 8, line 3, change "1" to --9--

Signed and Sealed this

Twelfth Day of April, 1994

*Attest:*

BRUCE LEHMAN

*Attesting Officer*   *Commissioner of Patents and Trademarks*